US010826147B2

United States Patent
Sikina et al.

(10) Patent No.: US 10,826,147 B2
(45) Date of Patent: Nov. 3, 2020

(54) RADIO FREQUENCY CIRCUIT WITH A MULTI-LAYER TRANSMISSION LINE ASSEMBLY HAVING A CONDUCTIVELY FILLED TRENCH SURROUNDING THE TRANSMISSION LINE

(71) Applicant: RAYTHEON COMPANY, Waltham, MA (US)

(72) Inventors: Thomas V. Sikina, Acton, MA (US); John P. Haven, Lowell, MA (US); James E. Benedict, Lowell, MA (US)

(73) Assignee: RAYTHEON COMPANY, Waltham, MA (US)

(*) Notice: Subject to any disclaimer, the term of this patent is extended or adjusted under 35 U.S.C. 154(b) by 70 days.

(21) Appl. No.: 16/183,169

(22) Filed: Nov. 7, 2018

(65) Prior Publication Data

US 2019/0148807 A1 May 16, 2019

Related U.S. Application Data

(60) Provisional application No. 62/691,810, filed on Jun. 29, 2018, provisional application No. 62/636,364, (Continued)

(51) Int. Cl.
*H01P 3/00* (2006.01)
*H01P 3/08* (2006.01)
(Continued)

(52) U.S. Cl.
CPC ............ *H01P 3/006* (2013.01); *H01P 3/08* (2013.01); *H01P 3/082* (2013.01); *H01P 3/085* (2013.01);
(Continued)

(58) Field of Classification Search
CPC .......... H01P 3/003; H01P 3/006; H01P 3/082; H01P 11/003; H01P 3/06; H01P 11/005; H05K 1/0219
(Continued)

(56) References Cited

U.S. PATENT DOCUMENTS 4,875,087 A 10/1989 Miyauchi et al.
5,401,175 A 3/1995 Guimond et al.
(Continued)

FOREIGN PATENT DOCUMENTS

CN 201845850 U 5/2011
CN 106936521 A 7/2017
(Continued)

OTHER PUBLICATIONS

Bailey, M. "General Layout Guidelines for RF and Mixed-Signal PCBs", Maxim Integrated (2011), pp. 1-10. Retrieved from URL: <<https://pdfserv.maximintegrated.com/en/an/AN5100.pdf>>.
(Continued)

*Primary Examiner* — Benny T Lee
(74) *Attorney, Agent, or Firm* — Lando & Anastasi, LLP (57) ABSTRACT

Circuits and methods include transmission lines formed from a conductive cladding on a substrate surface. The transmission line includes additional reference conductors positioned co-planar on the surface, including a gap between the transmission line and each of the reference conductors. The transmission line and the reference conductors are at least partially encapsulated (e.g., sandwiched) between two substrates. Isolation boundaries may be included as ground planes, e.g., above and below the transmission line, on opposing surfaces of the substrates, and Faraday walls, e.g., vertically, through the substrates. Current densities generated by various electromagnetic signals are distributed among the transmission line and the reference conductors
(Continued)

(as a tri-conductor arrangement), and may be partially further distributed to the isolation (ground) boundaries.

14 Claims, 7 Drawing Sheets

Related U.S. Application Data filed on Feb. 28, 2018, provisional application No. 62/636,375, filed on Feb. 28, 2018, provisional application No. 62/584,260, filed on Nov. 10, 2017, provisional application No. 62/584,264, filed on Nov. 10, 2017, provisional application No. 62/584,300, filed on Nov. 10, 2017.

(51) Int. Cl.
| | |
|---|---|
| *H05K 1/02* | (2006.01) |
| *H01P 11/00* | (2006.01) |
| *H05K 1/11* | (2006.01) |
| *H05K 3/00* | (2006.01) |
| *H05K 3/04* | (2006.01) |
| *H05K 3/10* | (2006.01) |
| *H05K 3/28* | (2006.01) |

(52) U.S. Cl.
CPC .......... *H01P 11/003* (2013.01); *H05K 1/0219* (2013.01); *H05K 1/0224* (2013.01); *H05K 1/115* (2013.01); *H05K 3/0044* (2013.01); *H05K 3/04* (2013.01); *H05K 3/107* (2013.01); *H05K 3/28* (2013.01); *H05K 2201/093* (2013.01); *H05K 2201/09854* (2013.01)

(58) Field of Classification Search
USPC ......................................................... 333/238
See application file for complete search history.

(56) References Cited

U.S. PATENT DOCUMENTS

| | | | |
|---|---|---|---|
| 5,426,399 A | | 6/1995 | Matsubayashi et al. |
| 5,828,555 A | | 10/1998 | Itoh |
| 5,857,858 A | | 1/1999 | Gorowitz et al. |
| 6,000,120 A | * | 12/1999 | Arledge et al. ....... H01P 11/005 29/600 |
| 6,137,453 A | | 10/2000 | Wang et al. |
| 6,353,189 B1 | | 3/2002 | Shimada et al. |
| 6,400,234 B1 | | 6/2002 | Ohhashi et al. |
| 6,486,755 B2 | | 11/2002 | Aruga |
| 6,651,322 B1 | | 11/2003 | Currie |
| 6,674,347 B1 | | 1/2004 | Maruhashi et al. |
| 6,747,217 B1 | | 6/2004 | Jochym et al. |
| 7,038,622 B2 | | 5/2006 | Schmidt et al. |
| 7,405,477 B1 | | 7/2008 | Tao et al. |
| 7,443,279 B2 | | 10/2008 | Yagisawa et al. |
| 8,749,434 B2 | | 6/2014 | Han et al. |
| 2003/0067410 A1 | | 4/2003 | Puzella et al. |
| 2003/0188889 A1 | | 10/2003 | Straub et al. |
| 2003/0201851 A1 | | 10/2003 | Yoshida et al. |
| 2006/0214744 A1 | | 9/2006 | Margomenos |
| 2009/0000804 A1 | * | 1/2009 | Kobayashi et al. .... H01P 3/003 174/117 F |
| 2010/0182105 A1 | | 7/2010 | Hein et al. |
| 2010/0206617 A1 | | 8/2010 | Johnson et al. |
| 2010/0254094 A1 | | 10/2010 | Ohhira |
| 2013/0009729 A1 | | 1/2013 | Kim |
| 2013/0154773 A1 | | 6/2013 | Siprak |
| 2015/0189754 A1 | | 7/2015 | Bohra et al. |
| 2015/0323576 A1 | | 11/2015 | Bulja et al. |
| 2016/0079646 A1 | * | 3/2016 | Ichige ................. H01B 7/0861 333/238 |
| 2016/0172741 A1 | | 6/2016 | Panat et al. |
| 2017/0117620 A1 | | 4/2017 | Lapushin |

FOREIGN PATENT DOCUMENTS

| | | |
|---|---|---|
| CN | 206742473 U | 12/2017 |
| EP | 1202377 A2 | 5/2002 |
| EP | 1473979 A1 | 11/2004 |
| GB | 2322237 A | 8/1998 |

OTHER PUBLICATIONS

International Search Report and Written Opinion in application No. PCT/US2018/059636 dated Mar. 4, 2019.
Farhan Shafique et al. "Laser machining of microvias and trenches for substrate integrated waveguides in LTCC technology", Proceedings of the 39th European Microwave Conference (2009), pp. 272-275.
Deslandes et al. "Integrated Microstrip and Rectangular Waveguide in Planar Form", IEEE Microwave and Wireless Components Letters (2001) vol. 11, No. 2, pp. 68-70.
International Search Report and Written Opinion in application No. PCT/US2018/059625 dated Mar. 4, 2019.
Leib et al. "An ultra-wideband vertical transition from microstrip to stripline in PCB technology", Proceedings of 2010 IEEE International Conference on Ultra-Wideband (2010), p. 1-4.
International Search Report and Written Opinion in application No. PCT/US2018/059240 dated Mar. 4, 2019.
Mukherjee et al. "Broadband Substrate Integrated Waveguide Cavity-Backed Bow-Tie Slot Antenna", IEEE Antennas and Wireless Propagation Letters (2014) vol. 13, p. 1152-1155.
Liu et al. "Broadband Circularly Polarized Antenna With High Gain for Ku-band Applications", IEEE Conference Proceedings (2017), p. 1-2.
Kim et al. "Slot-Coupled Circularly Polarized Array Antenna With Substrate-Integrated Waveguide Cavity for Parallel-Plate-Mode Suppression", IEEE Transactions on Antennas and Propagation (2017) vol. 65, No. 8, p. 3999-4006.
Luo et al. "Antenna Array Elements for Ka-band Satellite Communication on the Move", Loughborough Antennas & Propagation Conference (2013), p. 135-139.
Beeresha et al. "Embedded Microstrip Line to Stripline Vertical Transition Using LTCC Technique", International Journal of Research in Engineering and Technology (2015) vol. 4, Issue 12, pp. 30-34.
Shan et al. "A Compact Broadband Stripline-fed Slot Antenna for Array Application", IEEE International Workshop on Antenna Technology (2005), pp. 555-558.
International Search Report and Written Opinion in application No. PCT/US2018/059602 dated Apr. 18, 2019.
Hong et al. "Grid Assembly-Free 60-GHz Antenna Module Embedded in FR-4 Transceiver Carrier Board", IEEE Transactions on Antennas and Propagation (2013) vol. 61, No. 4, pp. 1573-1580.
Invitation to Pay Additional Fees in application No. PCT/US2018/059410 dated Apr. 23, 2019.
International Search Report and Written Opinion in application No. PCT/US2018/059841 dated Mar. 4, 2019.
Sitaraman et al. "Modeling, Design and Demonstration of Integrated Electromagnetic Shielding for Miniaturized RF SOP Glass Packages", Electronic Components & Technology Conference (2015), p. 1956-1960.
International Search Report in application No. PCT/US2019/019851 dated May 29, 2019.
Jung et al. "Inkjet-printed resistors with a wide resistance range for printed read-only memory applications", Organic Electronics (2013) vol. 14, pp. 699-702.
Kim et al. "Fabrication of Fully Inkjet-Printed Vias and SIW Structures on Thick Polymer Substrates", IEEE Transactions on Components, Packaging and Manufacturing Technology (2016) vol. 6, No. 3, pp. 486-496.
International Search Report and Written Opinion in application No. PCT/US2019/019847 dated May 29, 2019.

(56) References Cited

OTHER PUBLICATIONS

Kangasvieri et al. "An Ultra-Wideband BGA-Via Transition for High-Speed Digital and Millimeter-Wave Packaging Applications", IEEE (2007), pp. 1637-1640.

* cited by examiner

RADIO FREQUENCY CIRCUIT WITH A MULTI-LAYER TRANSMISSION LINE ASSEMBLY HAVING A CONDUCTIVELY FILLED TRENCH SURROUNDING THE TRANSMISSION LINE

CROSS-REFERENCE TO RELATED APPLICATIONS

This application claims the benefit under 35 U.S.C. § 119(e) of U.S. Provisional Patent Application No. 62/691,810 titled MILLIMETER WAVE TRANSMISSION LINE ARCHITECTURE filed on Jun. 29, 2018, U.S. Provisional Patent Application No. 62/584,260 titled SPIRAL ANTENNA AND RELATED FABRICATION TECHNIQUES filed on Nov. 10, 2017, U.S. Provisional Patent Application No. 62/584,264 titled ADDITIVE MANUFACTURING TECHNOLOGY (AMT) LOW PROFILE RADIATOR filed on Nov. 10, 2017, U.S. Provisional Patent Application No. 62/584,300 titled LOW PROFILE PHASED ARRAY filed on Nov. 10, 2017, U.S. Provisional Patent Application No. 62/636,364 titled SNAP-RF INTERCONNECTIONS filed on Feb. 28, 2018, and U.S. Provisional Patent Application No. 62/636,375 titled ADDITIVE MANUFACTURING TECHNOLOGY (AMT) LOW PROFILE SIGNAL DIVIDER filed on Feb. 28, 2018, each of which is herein incorporated by reference in its entirety for all purposes.

BACKGROUND

Radio frequency (RF) and electromagnetic circuits may be manufactured using conventional printed circuit board (PCB) processes. Conventional PCB manufacturing processes may include lamination, electroplating, masking, etching, and other complex process steps, and may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as transmission line (e.g., stripline) dimensions, and dimensions of dielectric materials between conductors (e.g., dielectric thickness, inter-via spacing, etc.), thereby limiting the range of highest frequency signals that may be supported by such circuits.

SUMMARY OF THE INVENTION

Aspects and embodiments described herein provide simplified circuit structures, and manufacturing methods thereof, for conveyance of electrical signals, especially radio frequency signals, within a circuit. Various embodiments of circuits in accordance with those described herein may be constructed of, e.g., laminate or dielectric substrates, and may have circuit features, signal layers, ground planes, or other circuit structures therebetween. Further, various signal conductors and circuit structures may be fabricated more simply and with smaller feature sizes than conventional techniques. Such circuit structures are suitable for higher frequency operation into the millimeter wave range, as well as conventional microwave ranges. Circuits, structures, and fabrication methods described herein use subtractive and additive manufacturing technology to achieve smaller sizes and higher frequency operation.

One aspect of the present disclosure is directed to a radio frequency circuit comprising a first dielectric substrate having a first surface, a second dielectric substrate having a second surface, the first and second dielectric substrates being positioned relative to one another such that the second surface faces the first surface, a transmission line formed from a conductive cladding disposed upon the first surface, the transmission line being at least partially encapsulated between the first dielectric substrate and the second dielectric substrate, and a pair of reference conductors, each of the pair of reference conductors positioned adjacent to and co-planar with the transmission line and spaced such that there is a gap between each of the pair of reference conductors and the transmission line, each of the pair of reference conductors disposed upon the first surface or the second surface and being at least partially encapsulated between the first dielectric substrate and the second dielectric substrate.

Embodiments of the radio frequency circuit further may include a pair of ground planes, with each of the pair of ground planes being positioned substantially parallel to the co-planar arrangement of the transmission line and the pair of reference conductors. The radio frequency circuit further may include a pair of boundary walls disposed substantially perpendicular to the pair of ground planes and the co-planar arrangement of the transmission line and the pair of reference conductors, with the pair of boundary walls being electrically continuous and in electrical contact with the pair of ground planes such that the pair of boundary walls and the pair of ground planes form a conductive electromagnetic boundary around the transmission line in at least two dimensions. The pair of boundary walls may be in electrical contact with the pair of reference conductors. The radio frequency circuit further may include an electrical conductor disposed through a hole in at least one of the first dielectric substrate and the second dielectric substrate, the electrical conductor being in electrical contact with the transmission line. The radio frequency circuit further may include an electrical component in electrical contact with the electrical conductor and configured to send or receive an electromagnetic signal to or from the transmission line via the electrical conductor, with the electrical component being at least one of a terminal, a connector, a cable, and an electromagnetic radiator. The transmission line may produce 1.2 decibels or less of insertion loss per inch at 70 GHz. The pair of reference conductors may be formed from the conductive cladding disposed upon the first substrate.

Another aspect of the disclosure is directed to a method of fabricating an electromagnetic circuit. In one embodiment, the method comprises: providing a first dielectric substrate having a conductive cladding disposed upon a first surface thereof; machining the conductive cladding to remove a portion of the conductive cladding to form a transmission line, the removed portion forming a gap between the transmission line and a remaining portion of the conductive cladding, at least some of the remaining portion of the conductive cladding forming a pair of reference conductors on either side of, and co-planar with, the transmission line; and providing a second dielectric substrate having a second surface and positioning the second dielectric substrate so that the second surface faces the first surface, thereby at least partially encapsulating the transmission line and the pair of reference conductors between the first dielectric substrate and the second dielectric substrate.

Embodiments of the method further may include providing the first dielectric substrate with a first ground plane disposed on a third surface, with the third surface being an opposing and substantially parallel surface to the first surface, and providing the second dielectric substrate with a second ground plane disposed on a fourth surface, with the fourth surface being an opposing and substantially parallel surface to the second surface, each of the first ground plane and the second ground plane being substantially parallel to each other and to the co-planar arrangement of the transmission line and the pair of reference conductors. The method further may include machining the first dielectric substrate and the second dielectric substrate to form a trench through the first dielectric substrate and the second dielectric substrate, with the trench extending between and being substantially perpendicular to the first ground plane and the second ground plane; and filling the trench with a conductive material, with the conductive material arranged to be in electrical contact with each of the first ground plane and the second ground plane. The conductive material also may be arranged to be in electrical contact with the pair of reference conductors. The method further may include drilling a hole in at least one of the first dielectric substrate and the second dielectric substrate to provide access to a portion of the transmission line; and providing an electrical conductor disposed through the hole, the electrical conductor arranged to be in electrical contact with the transmission line. The method further may include electrically coupling the electrical conductor to an electrical component, the electrical conductor being thereby configured to convey a signal between the transmission line and the electrical component, the electrical component being at least one of a terminal, a connector, a cable, and an electromagnetic radiator. The method further may include conveying to the transmission line an electromagnetic signal having a frequency in the range of 24 GHZ to 75 GHz.

Yet another aspect of the disclosure is directed to a transmission line assembly comprising a pair of dielectric substrates, an electrical conductor at least partially embedded between the pair of dielectric substrates, a pair of reference conductors at least partially embedded between the pair of dielectric substrates and positioned to be co-planar with the electrical conductor and spaced apart from the electrical conductor by a gap, a pair of ground planes, with each of the pair of ground planes disposed adjacent to an outer surface of one of the pair of dielectric substrates, and each of the pair of ground planes being substantially parallel to each other and to the co-planar arrangement of the electrical conductor and the pair of reference conductors, and a pair of electromagnetic boundaries formed of an electrically continuous conductor disposed through the pair of dielectric substrates, substantially extending between the pair of ground planes and in electrical communication with the pair of ground planes.

Embodiments of the transmission line assembly further may include a first electrical component electrically coupled to a first end of the electrical conductor and a second electrical component electrically coupled to a second end of the electrical conductor, with the electrical conductor being configured to convey an electromagnetic signal of greater than 24 GHz between the first electrical component and the second electrical component. The pair of electromagnetic boundaries may be in electrical communication with the pair of reference conductors. The electrical conductor may be a first electrical conductor and further comprising a second electrical conductor in electrical communication with the first electrical conductor, with the second electrical conductor disposed through at least one of the pair of dielectric substrates. The transmission line assembly further may include an electrical component in electrical contact with the second electrical conductor and configured to send or receive an electromagnetic signal to or from the first electrical conductor via the second electrical conductor, the electrical component being at least one of a terminal, a connector, a cable, and an electromagnetic radiator.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures.

DETAILED DESCRIPTION OF THE INVENTION

Aspects and examples described herein provide signal conductors (e.g., transmission lines, signal traces, strip lines) with reference surfaces and conductors within various circuits for the containment and conveyance of millimeter wave signals. The transmission line structures described herein efficiently distribute signal currents while maintaining characteristic impedance and minimizing signal loss along the transmission line. The transmission line structures described herein are suitable for various circuit board manufacturing, including radio frequency circuit embodiments, and advantageously apply subtractive and additive manufacturing techniques. Such techniques may provide structures capable of conveyance and containment of radio frequency signals in microwave and millimeter wave ranges, for example from 28 GHz to 70 GHz, and up to 300 GHz or more.

Conventional transmission line architectures rely heavily on a center conductor, producing a significant concentration of radio frequency current on the center conductor as a result. The resulting current concentration, combined with a frequency dependent skin effect, produces insertion loss that increases exponentially with respect to frequency. As a result, conventional transmission lines produce significant loss, and begin to defeat their purpose of conveying radio frequency energy when used at higher frequencies, e.g., into the millimeter wave ranges. Waveguides have also been considered as a possible conventional approach, but also exhibit high current density, e.g., on the E-plane walls.

Transmission line architectures in accordance with structures and methods described herein overcome the above limiting factors by distributing the radio frequency current over a larger surface area, such that the signal loss mechanism is overcome while accommodating intrinsic skin effects. In various embodiments, transmission line architectures described herein retain the characteristics of transverse electromagnetic (TEM) wave propagation, with linear dispersion, low insertion loss, and a fixed characteristic impedance. The geometry uses multiple conducting surfaces, and a configuration that orients the electric field orthogonal to the conducting surfaces. Transmission lines and methods in accordance with those described herein distribute signal currents over three principal conductors in combination with ground planes (e.g., horizontal) and other Faraday boundaries (e.g., vertical).

In some embodiments, a transmission line (e.g., conductor) may be formed on a dielectric substrate by machining away (e.g., milling) a portion of cladding (e.g., electroplate copper) from a surface of the substrate.

In some embodiments, a wire conductor may convey a signal "vertically" between layers (e.g., to/from a transmission line) within a circuit, and may be used to feed a signal to or from various other layers or circuit components, such as a waveguide, a radiator (e.g., an antenna), a connector, or other circuit structures. Such a "vertical" inter-layer signal feed may be formed by machining a hole in one or more dielectric substrates, applying solder to one or more conductor surfaces, inserting a segment of wire (e.g., copper wire) into the hole, and reflowing the solder to mechanically and electrically secure a connection.

In some embodiments, a continuous conducting structure may be formed in one or more dielectric substrates by machining a trench and filling the trench with a conductor, such as a conductive ink applied using 3-D printing techniques, to form an electromagnetic boundary. Such an electromagnetic boundary may enforce boundary conditions of an electromagnetic signal, e.g., to control or limit modes of a signal and/or characteristic impedance, or may provide isolation to confine signals to a region of an electromagnetic circuit, e.g., a Faraday boundary to prevent a signal at one region of the circuit from affecting another region of the circuit, e.g., shielding.

Manufacturing processes described herein may be particularly suitable for fabrication of circuit structures having physically small features capable of supporting electromagnetic signals in the range of 8 to 75 GHz or more, for example, and up to 300 GHz or more, using suitable subtractive (e.g., machining, milling, drilling, cutting, stamping) and additive (e.g., filling, flowing, 3-D printing) manufacturing equipment. Electromagnetic circuit structures in accordance with systems and methods described herein may be particularly suitable for application in 28 to 70 GHz systems, including millimeter wave communications, sensing, ranging, etc. Aspects and embodiments described may also be suitable for lower frequency ranges, such as in the S-band (2-4 GHz), X-band (8-12 GHz), or others.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals, for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, systems and methods in accordance with those described herein may be suitable for handling non-ionizing radiation, at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein.

The methods and apparatuses described herein may support smaller arrangements and dimensions than conventional processes are capable. Conventional circuit boards may be limited to frequencies below about 30 GHz. The methods and apparatuses described herein may allow or accommodate the manufacture of electromagnetic circuits of smaller dimensions, suitable for radio frequency circuits intended to be operated at higher frequencies, using safer and less complex manufacturing, at lower cost.

Electromagnetic circuits and methods of manufacture in accordance with those described herein include various additive and subtractive manufacturing techniques to produce electromagnetic circuits and components capable of handling higher frequencies, with lower profiles, and at reduced costs, cycle times, and design risks, than conventional circuits and methods. Examples of techniques include machining (e.g., milling) of conductive material from a surface of a substrate to form transmission lines (e.g., signal conductors, striplines) or apertures, which may be of significantly smaller dimensions than allowed by conventional PCB processes, machining of one or more substrates to form a trench, using 3-dimensional printing techniques to deposit printed conductive inks into the trench to form a continuous electric barrier (e.g., a Faraday wall) (as opposed to a series of ground vias with minimum spacing therebetween), "vertical launch" signal paths formed by machining (such as milling, drilling, or punching) a hole through a portion of substrate and in which a conductor (such as a wire segment) is placed and/or conductive ink is printed, to make electrical contact to a transmission line disposed on a surface of the substrate (or an opposing substrate), and using 3-dimensional printing techniques to deposit printed resistive inks to form resistive components.

Any of the above example techniques and/or others (e.g., soldering and/or solder reflow), may be combined to make various electromagnetic components and/or circuits. Aspects and examples of such techniques are described and illustrated herein with respect to a radio frequency transmission line to contain and convey an electromagnetic signal along a layer of an electromagnetic circuit in one dimension and, optionally, vertically through to other layers of the circuit in another dimension. The techniques described herein may be used to form various electromagnetic components, connectors, circuits, assemblies, and systems.

Figure 1:
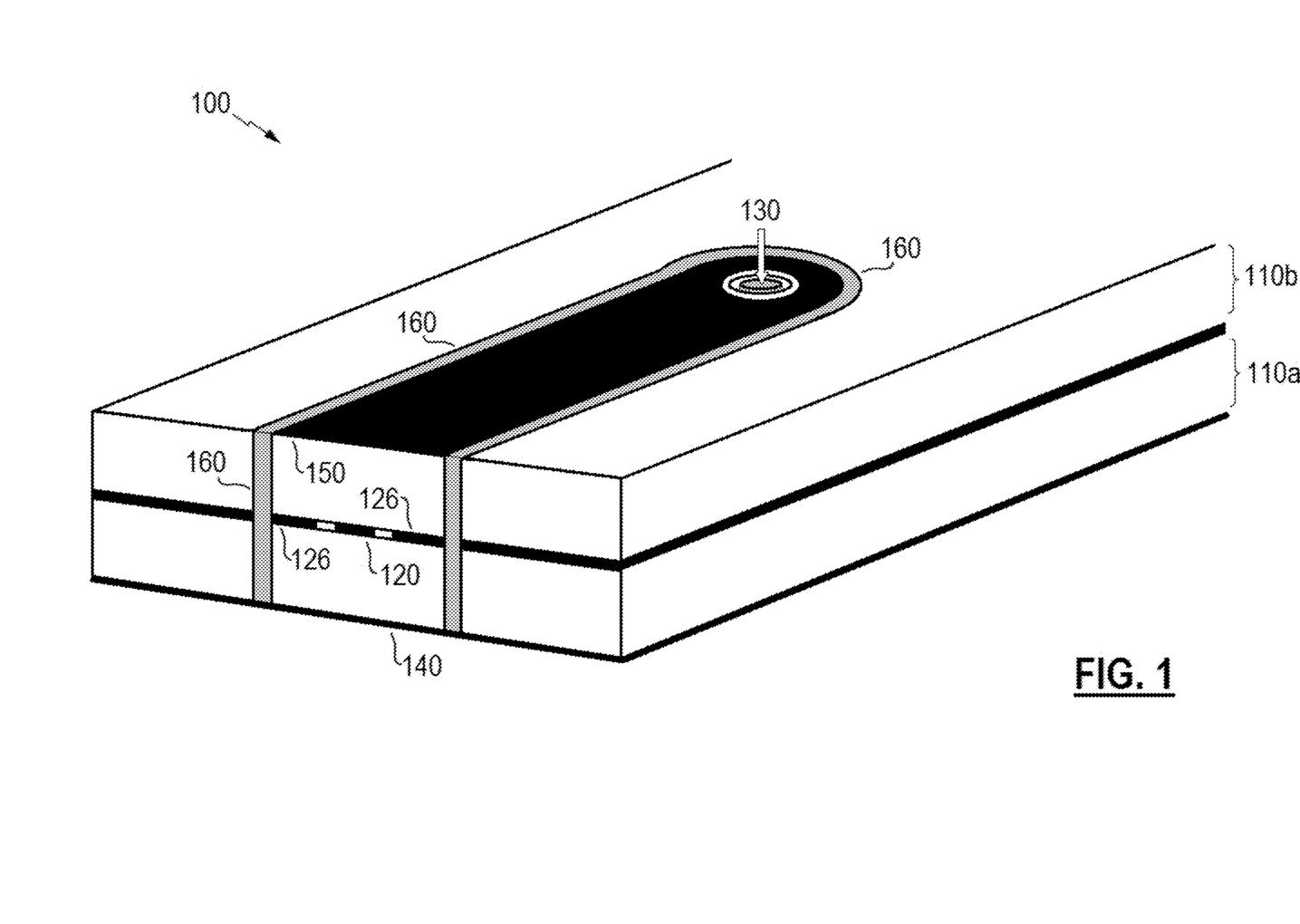
FIG. 1 is a schematic diagram of an example of an electromagnetic circuit portion that includes a Faraday wall.

FIG. 1 illustrates an example of an electromagnetic circuit structure 100 that may be a portion of a larger electromagnetic circuit. The circuit structure 100 includes a pair of dielectric substrates 110a, 110b bonded together and having a transmission line 120 enclosed between them. The transmission line 120 is an electrical conductor configured to convey electromagnetic signals within the circuit, e.g., within the circuit structure 100, and may be formed by machining away a cladding, such as electroplated copper, from a surface of either of the substrates 110a, 110b. Signals conveyed by the transmission line 120 may be defined by electric and magnetic fields, with reference to further conductor(s). For example, the transmission line 120 is circumscribed by reference conductors 126, which are co-planar conductors, providing a secondary or "return path" electrical conductor for signals conveyed by the transmission line 120. In some examples, the term "transmission line" may include the combination of the transmission line 120 (a first conductor) and its associated reference conductors 126 (a second conductor). In various examples, the reference conductors 126 may be coupled to a ground reference. The transmission line 120 exhibits a characteristic impedance for signals of various frequencies, and the characteristic impedance may depend upon a size of the transmission line 120 (e.g., height and width), a size of the gap(s) between the transmission line 120 and the reference conductors 126, and material characteristics of the substrates 110a, 110b and the gap(s). In various embodiments, gaps between the transmission line 120 and the reference conductors 126 may be filled with a bonding material, e.g., and adhesive used to bond the substrates 110a, 110b together.

The transmission line 120 may also have an electrical connection, such as by solder, to a "vertical launch" conductor 130, which may be disposed within a machined hole in the substrate 110b. Accordingly, the conductor 130 and the transmission line 120 may form an electrically continuous signal conveyance, and each may convey and provide signals beyond the extent of the portion shown in FIG. 1. In some examples, the conductor 130 may be a segment of wire, such as a copper wire. In various examples, the conductor 130 may be any of various forms, such as solid, hollow, rigid, flexible, straight, coil, spiral, etc. Additional details of at least one example of a vertical launch and its manufacture are disclosed in U.S. patent application Ser. No. 15/988,296 titled ADDITIVE MANUFACTURING TECHNOLOGY MICROWAVE VERTICAL LAUNCH filed on May 24, 2018, which is hereby incorporated herein by reference for all purposes.

In some embodiments, a ground plane 140 may be provided and may be formed of a conductive cladding disposed upon a "bottom" surface of the substrate 110a. An additional ground plane 150 may be provided upon a "top" surface of the substrate 110b. For example, the ground plane 150 may be formed by a conductive cladding disposed upon the substrate 110b. A portion of the conductive cladding may be removed by machining (e.g., milling) to provide a ground plane with an appropriate physical dimension, shape, or extent, e.g., to be suitable to act as the ground plane 150.

Conventional PCB fabrication techniques may incorporate ground planes as reference conductors for a signal trace or strip line and, accordingly, may impose requirements on a distance between the ground planes and to the signal trace therebetween, e.g., to establish a characteristic impedance for signals conveyed by the signal trace. By contrast, the transmission line 120 is provided with reference conductors 126, such that the ground planes 140, 150 may have little to no impact on the characteristic impedance, may instead serve as isolation or shielding from other circuit components, and may be further away than conventionally required.

Accordingly, the transmission line 120, and the gap(s) between the transmission line 120 and the reference conductors 126, may be particularly small, such as down to 2 mils (0.002 inches) or less, e.g., to accommodate millimeter wave signals. Accordingly, an impedance of the transmission line 120 may be less affected by the presence of the ground planes 140, 150, which may allow the thickness of the substrate 110a, 110b to be designed or selected based upon alternate concerns (e.g., strength, rigidity, etc.).

Additionally, electromagnetic signal(s) conveyed by the transmission line 120 are conveyed by the combination of the transmission line 120, the reference conductors 126, and the gap therebetween, such that current density is distributed among the conductors (at least the transmission line 120 and the reference conductors 126), resulting in lower current densities than conventional transmission lines using PCB fabrication techniques. Accordingly, signal losses per distance of transmission may be reduced as compared to conventional PCB transmission line structures and manufacturing techniques.

The circuit structure 100 also includes a Faraday wall 160 that is a conductor providing shielding or isolation as an electromagnetic boundary "vertically" through the substrates 110a, 110b. The Faraday wall 160 may be formed by machining a trench through the substrates 110a, 110b down to the ground plane 140 and filling the trench with a conductive material, such as a conductive ink applied with additive manufacturing techniques, e.g., 3-D printing. The conductive ink, when set, may form a substantially electrically continuous conductor. As shown, the trench in which the Faraday wall 160 is formed does not pierce or go through the ground plane 140. The Faraday wall 160 may therefore be in electrical contact with the ground plane 140. Additionally, a "top" of the Faraday wall 160 may be in electrical contact with the ground plane 150, which may be accomplished by slight over-filling of the machined trench to ensure contact between the conductive ink and the ground plane 150 and/or by application of solder, for example. Additional details of at least one example of a Faraday wall and its manufacture are disclosed in U.S. patent application Ser. No. 16/184,571 titled ADDITIVE MANUFACTURING TECHNOLOGY (AMT) FARADAY BOUNDARIES IN RADIO FREQUENCY CIRCUITS filed on Nov. 8, 2018, which is hereby incorporated herein by reference for all purposes.

As illustrated in FIG. 1, the ground plane 140, ground plane 150, and Faraday wall 160 together form a substantially electrically continuous conductor that provides an isolation boundary for signal(s) conveyed by the transmission line 120 and its associated reference conductors 126. In some embodiments, dimensional placement of the ground planes 140, 150 and the Faraday wall 160 may be selected to control or limit a propagating mode of a signal conveyed by the transmission line 120 and/or to establish a characteristic impedance for signal(s) conveyed by the transmission line 120. In certain embodiments, the ground planes 140, 150 and the Faraday wall 160 may be positioned such that only a transverse electromagnetic (TEM) signal mode may propagate along the transmission line 120. In other embodiments, the Faraday wall 160 may be positioned to isolate one portion of a circuit from another portion of a circuit without enforcing a particular propagating mode and/or without contributing to an impedance for any particular signal(s).

As stated above, the structure 100 is merely an example and portion of a structure in which an electromagnetic circuit may be provided. Further extent of the substrates shown may accommodate various circuit components, and additional substrates having additional layers to accommodate additional circuit components may be provided in various embodiments. Typically, a portion of a circuit may be disposed on a particular layer, and may include ground planes above and/or below, and other portions of a total circuit (or system) may exist at different regions of the same layer or on other layers.

Figure 2:
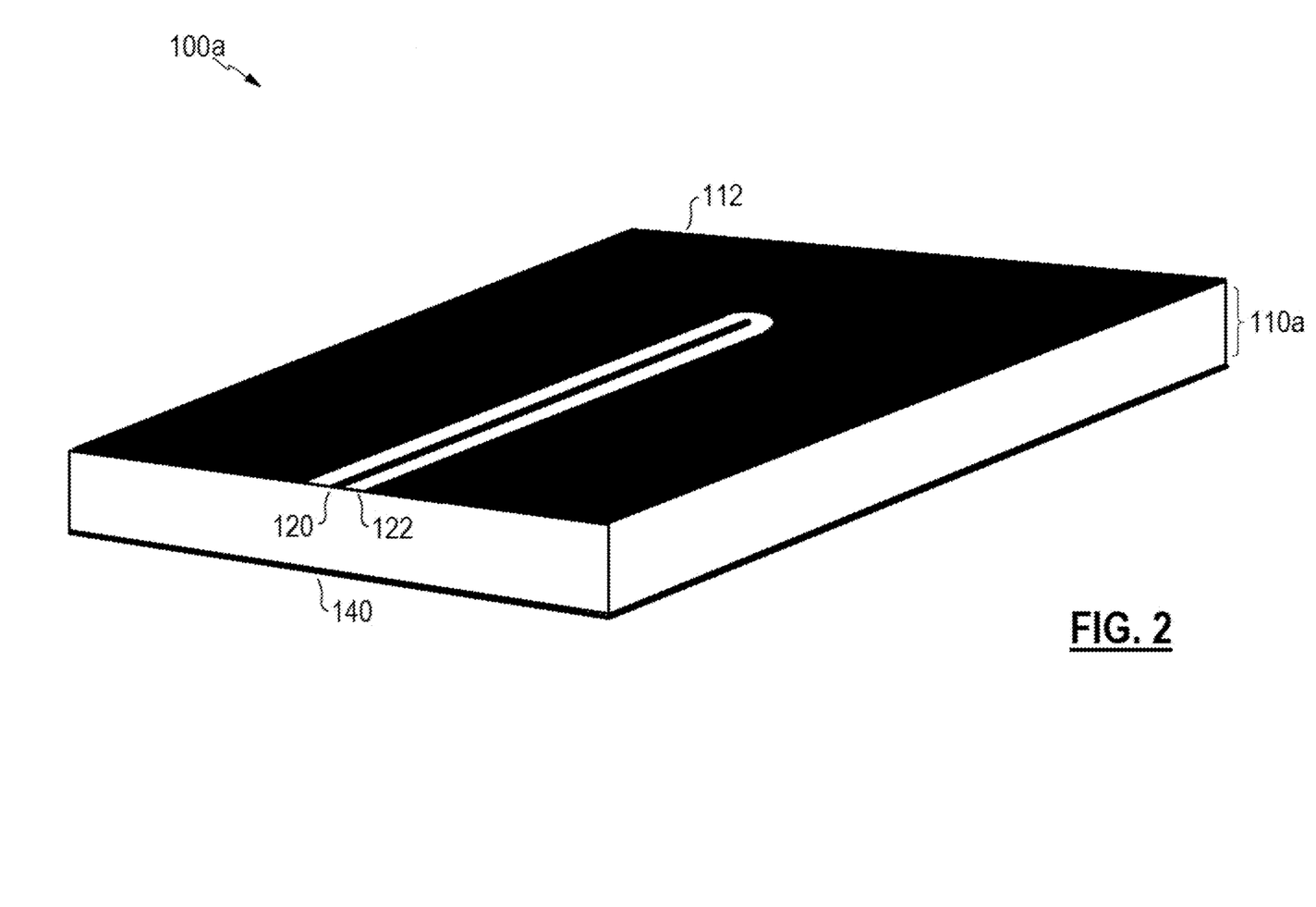
FIG. 2 is a schematic diagram of a stage of manufacture of the electromagnetic circuit portion of FIG. 1.

FIG. 2 shows a portion structure 100a of the circuit structure 100 as illustrated in FIG. 1 at one stage of manufacture, in accordance with aspects and embodiments of the systems and methods described herein. The portion structure 100a includes the substrate 110a which may be provided with conductive (e.g., copper) cladding on various surfaces. In this example, the substrate 110a has a conductive cladding 112 on one surface that serves as the conductive material from which the transmission line 120 and the reference conductors 126 are formed. Also in this example, the substrate 110a has a conductive cladding on an opposing surface to serve as the ground plane 140. The transmission line 120 may be formed by machining away at least a portion 122 of the cladding 112, thereby leaving a portion of conductive material to serve as the transmission line 120, distinct from the remainder of the cladding 112.

Figure 3:
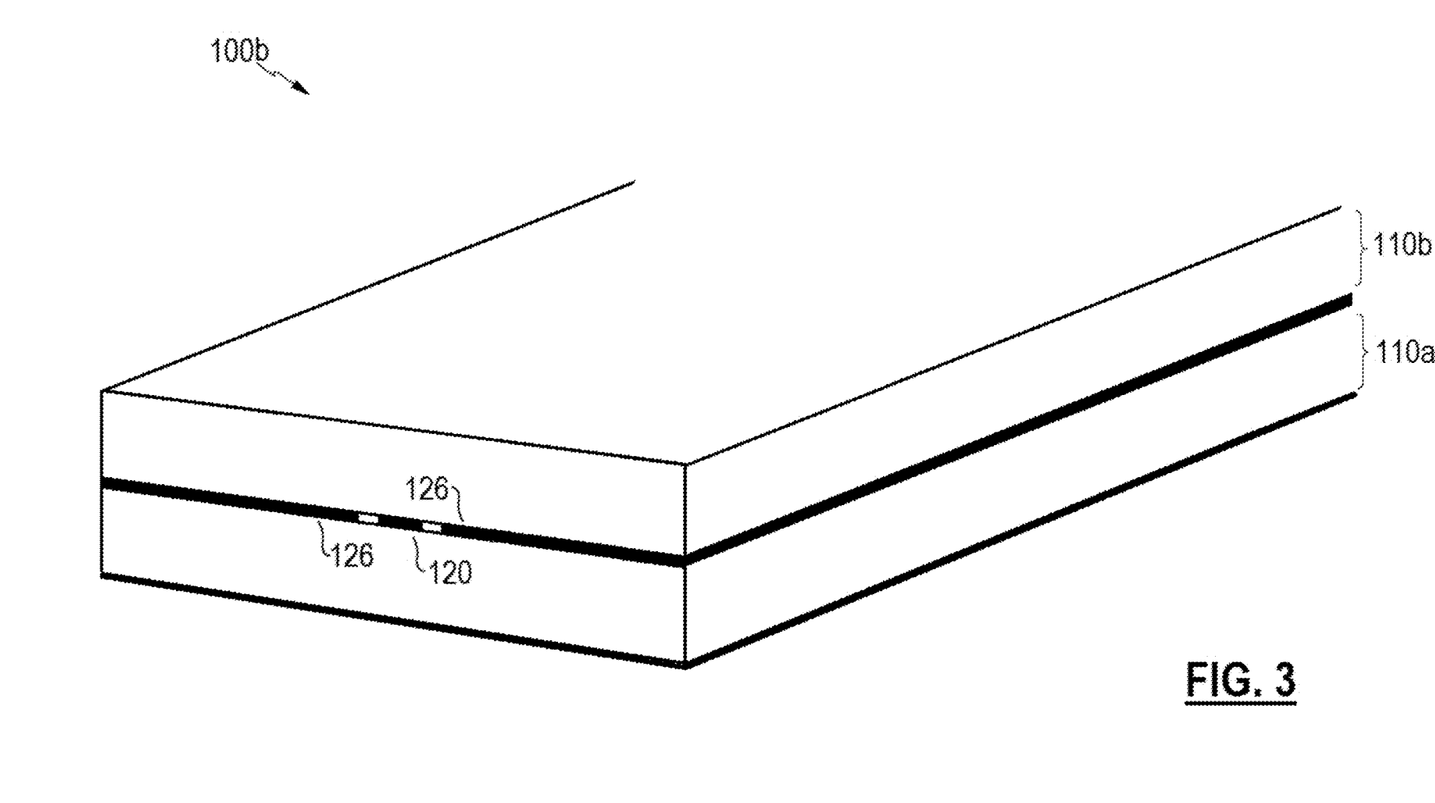
FIG. 3 is a schematic diagram of another stage of manufacture of the electromagnetic circuit portion of FIG. 1.

FIG. 3 shows another portion structure 100b of the circuit structure 100 as illustrated in FIG. 1 at another stage of manufacture. For the portion structure 100b, the substrate 110b is aligned with the substrate 110a, to be bonded together. In some examples, a temporary bonding or affixing may be applied and a permanent bonding step may be applied at a later time, such as a bonding that may require heat or baking to cure or to secure a permanency of the bonding. Various examples may have a hole in the substrate 110b positioned to align with a portion of the transmission line 120, e.g., to accommodate the conductor 130 illustrated in FIG. 1. In various embodiments, a "top" surface of the substrate 110b may include a conductive cladding, which may be used to provide a ground plane, if desired. As with the cladding 112 as illustrated in FIG. 2, portions of any cladding on the substrate 110b may be machined away to form various other structures, components, or a ground plane having a desired shape or extent.

With reference to FIG. 2, the conductive cladding 112 from which the transmission line 120 is formed (e.g., by machining away the portion 122) may equivalently be associated with the substrate 110b, e.g., on a "bottom" side with respect to FIG. 3, instead of being associated with the substrate 110a. In other words, the conductive material from which the transmission line 120 is provided may be a conductive cladding associated with either of the substrates 110a, 110b. Further, the transmission line 120 and/or reference conductors 126 may be provided from differing materials and/or through other means in various embodiments.

Figure 4:
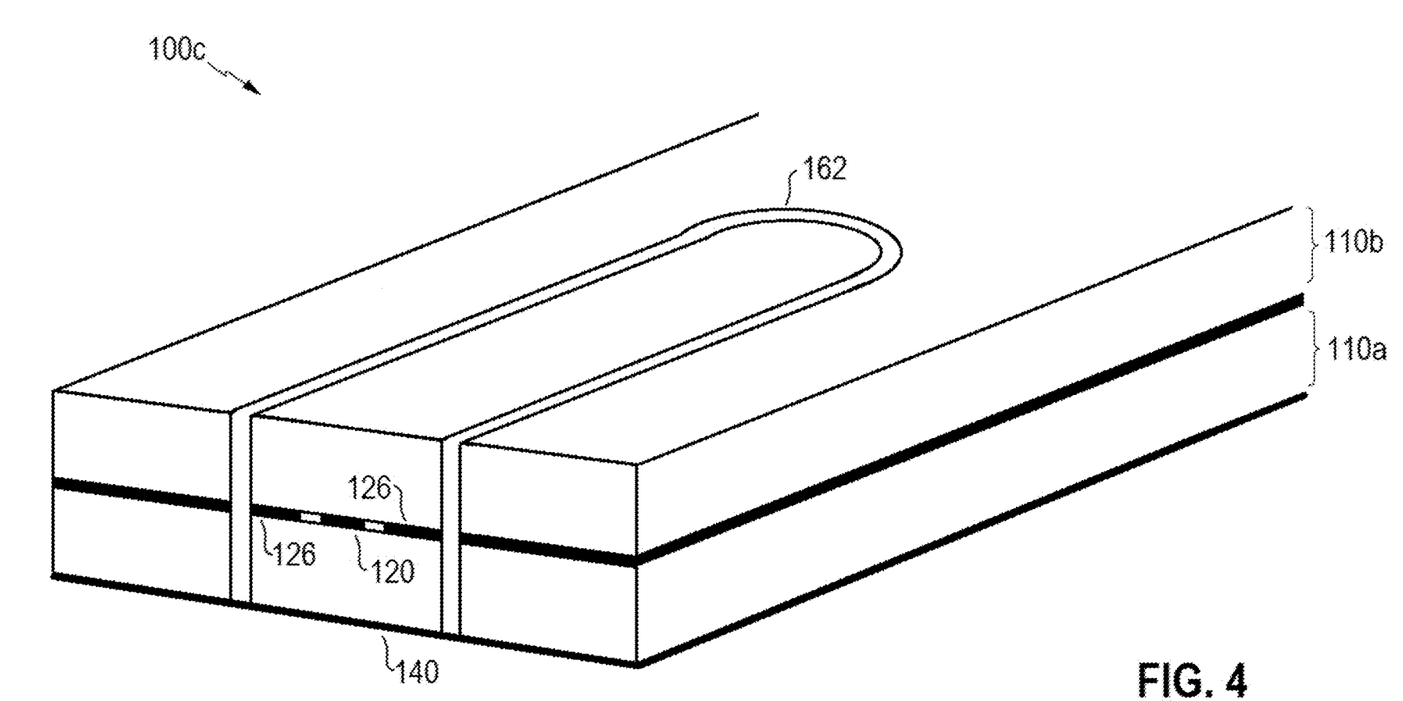
FIG. 4 is a schematic diagram of another stage of manufacture of the electromagnetic circuit portion of FIG. 1.

FIG. 4 shows another portion structure 100c of the circuit structure 100 at another stage of manufacture. For the portion structure 100c, a trench 162 is milled through the substrates 110a, 110b. In this example, the trench 162 is milled through the substrates 110a, 110b and a portion of the cladding 112 as illustrated in FIG. 2, down to the conductive cladding that forms the ground plane 140. Machining away material to form the trench 162 may also form the reference conductors 126, e.g., by separating a further portion of the cladding 112, leaving a portion of conductive material to serve as the reference conductors 126, distinct from the remainder of the cladding 112. In various embodiments, the trench 162 is milled down to the ground plane 140 without piercing the ground plane 140. In some embodiments, the intact ground plane 140 may provide structural support to portions of the structure 100c while the trench is empty.

Figure 5:
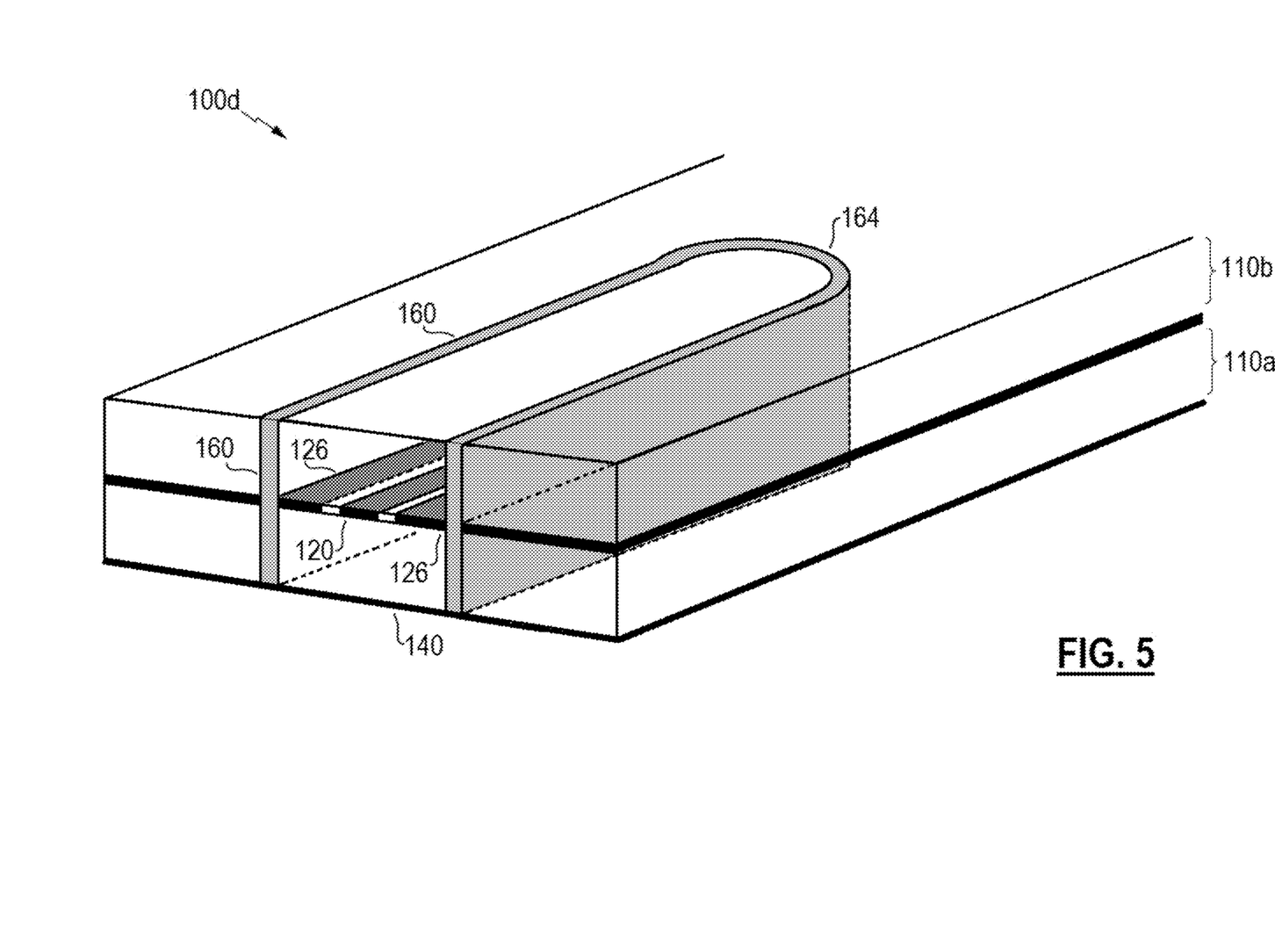
FIG. 5 is a schematic diagram of another stage of manufacture of the electromagnetic circuit portion of FIG. 1.

FIG. 5 shows another portion structure 100d of the circuit structure 100 as illustrated in FIG. 1 at another stage of manufacture. In the portion structure 100d, the trench 162 as shown in FIG. 4 is filled with a conductive fill 164 to form the Faraday wall 160. The conductive fill 164 may make electrical contact with the ground plane 140 to form a substantially electrically continuous ground boundary. As described above with respect to FIG. 1, a further ground plane 150 may be included, and to which the conductive fill 164 may be electrically connected by physical contact and/or by further application of solder at positions along the Faraday wall 160, to electrically join with the ground plane 150. In some embodiments, the intact ground plane 140 and the cured (e.g., cooled, solidified) conductive fill 164 may provide structural support to the structure 100d, e.g., in place of the material(s) that was machined away to form the trench 162.

Figure 6:
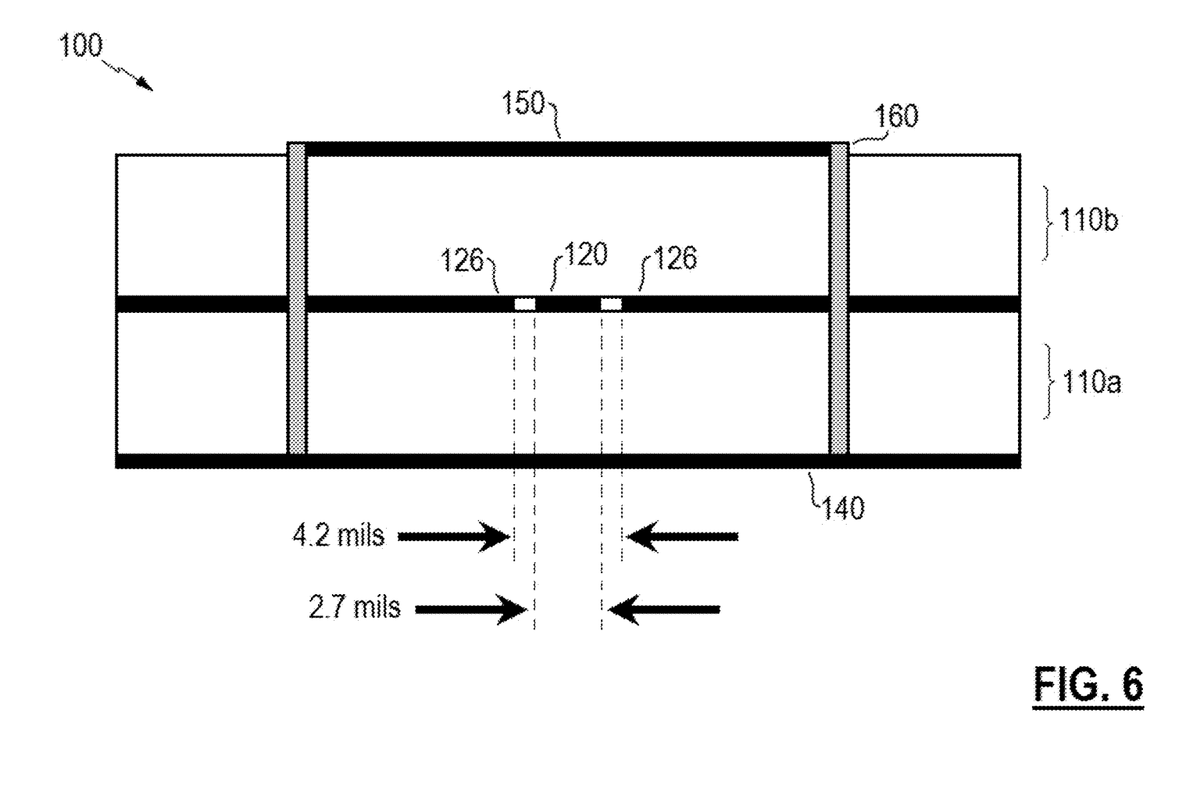
FIG. 6 is a schematic diagram of another view of the electromagnetic circuit portion of FIG. 1.

FIG. 6 illustrates one example of a set of dimensions for the transmission line 120 and the gap separating the transmission line 120 from the reference conductors 126. In this example, a portion of cladding is machined away to provide a 2.7 mil wide transmission line 120. Accordingly, the edges of the reference conductors 126 are 4.2 mils away from each other, leaving a 0.75 mil gap between the transmission line 120 and each of the reference conductors 126 (e.g., the width of the machined away portion of cladding).

Dimensional information shown in the figures is for illustrative purposes and is representative of some dimensions that may be desirable or suitable for certain applications, and may be illustrative of some dimensions achievable with the methods described herein. In various embodiments, dimensions may be significantly smaller, or may be larger, depending upon the capabilities of the subtractive and additive equipment used in production, and depending upon the design and application of a particular circuit.

Figure 7:
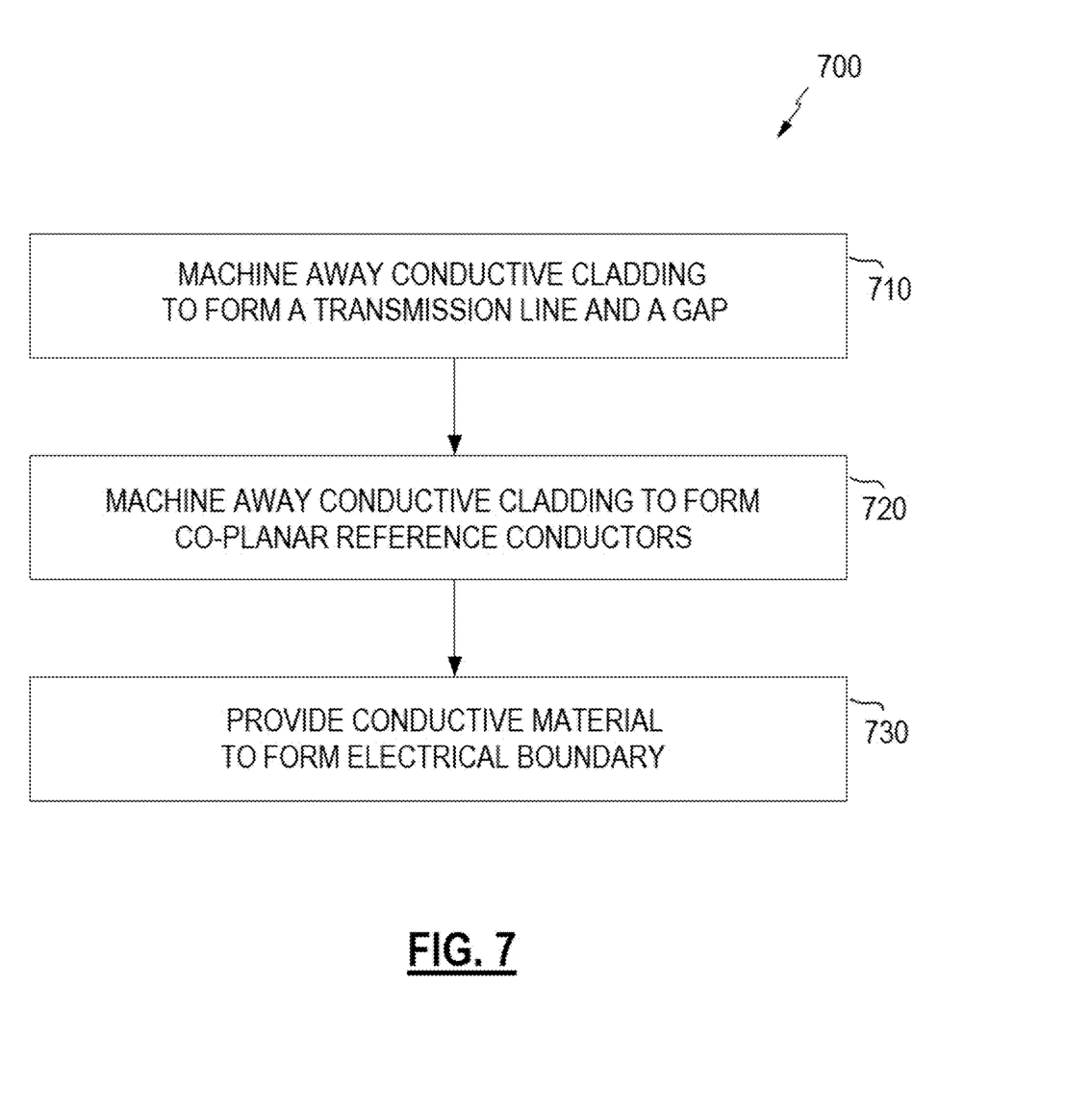
FIG. 7 is a flow diagram of a method of fabricating a transmission line.

FIG. 7 illustrates a method 700 of fabricating a millimeter wave transmission line in accordance with aspects and examples described herein. The method 700 includes machining away a conductive material (e.g., cladding)

(block 710) to form a transmission line, and the machined away area forms a gap. The reference conductors are formed by machining away further conductive material (e.g., cladding) (block 720) that is co-planar with the transmission line. Machining away conductive material to form co-planar reference conductors (as in block 720) may be part of machining a trench through one or more substrates that simultaneously machines away a cladding on one of the substrates. Various conductive material may be provided (block 730) to form one or more electrical barriers, that may isolate the transmission line 120 and reference conductors 126 from other portions of a circuit or system. For example, filling a trench with a conductive material may form an electrical boundary, and/or including cladding on one or more substrates may form an electrical boundary, e.g., as a ground plane.

Further advantages of system and methods described herein may be realized. For example, conventional PCB manufacturing may impose limitations on circuit feature sizes, such as the width of transmission lines, thus limiting the highest frequencies for which conventionally made electromagnetic circuits may be suitable. Further, substrate thicknesses impact characteristic impedance (e.g., due to the distance to ground planes disposed upon opposing surfaces) in relation to width of the traces. Accordingly, wider traces required by conventional PCB processes cause selection of thicker substrates (to maintain a particular characteristic impedance), thus limiting how thin the circuit can be manufactured. For example, general recommendations under conventional PCB manufacturing include total thicknesses of about 60 mil (0.060 inches). By comparison, electromagnetic circuits in accordance with aspects and embodiments described, using additive manufacturing techniques, can result in circuit boards having a low profile down to a thickness of about 10 mil or less, with signal line traces having widths of about 4.4 mil, or 2.7 mil, or less, and interconnect geometries substantially flush with a surface of the board.

Ground vias conventionally provide electrical connectivity between ground planes (e.g., on opposing surfaces of substrates) and provide some isolation of signals on the traces from other traces that may be nearby. The conventional ground vias are drilled holes of about 8 mil diameter or greater, and are required to be a minimum distance apart to maintain structural integrity of the board. Accordingly, ground vias are leaky structures, exhibiting loss of electromagnetic signal, especially at higher frequencies. As various applications require support for higher frequency signals, the minimum spacing between ground vias act like large openings through which relatively small wavelengths of electromagnetic energy may escape.

By comparison, electromagnetic circuits and methods in accordance with aspects and embodiments described herein, which use additive manufacturing techniques, allow for electrically continuous Faraday boundaries, which may further be electrically coupled to ground planes. Accordingly, an electrically continuous structure is provided and disposed vertically through one or more substrates, (e.g., between opposing surfaces of the substrate) to form "Faraday walls" that confine electromagnetic fields. In various embodiments, such Faraday walls may electrically couple two or more ground planes. Further in various embodiments, such Faraday walls may confine and isolate electromagnetic fields from neighboring circuit components. In some embodiments, such Faraday walls may enforce a boundary condition to limit electromagnetic signals to be locally transverse electric-magnetic (TEM) fields, e.g., limiting signal propagation to a TEM mode.

In various embodiments, various subtractive (machining, milling, drilling), additive (printing, filling), and adherent (bonding) steps may be carried out, in various orders, with soldering and reflow operations as necessary, to form an electromagnetic circuit having one or any number of substrate layers, which may include one or more Faraday boundaries as described herein.

A generalized method for making any of various electromagnetic circuits includes milling a conductive material disposed on a substrate to form circuit features. The method may include printing (or depositing, e.g., via 3-D printing, additive manufacturing techniques) additional circuit features, such as resistors formed of resistive ink, for example. The method may include depositing solder on any feature, as necessary. The method may also include milling (or drilling) through substrate material (and/or conductive materials) to form openings, such as voids or trenches, and includes depositing or printing (e.g., via 3-D printing, additive manufacturing techniques) conductive material (such as conductive ink or a wire conductor) into the voids/trenches, for example to form Faraday walls or vertical signal launches (e.g., copper). Any of these steps may be done in different orders, repeated, or omitted as necessary for a given circuit design. In some embodiments, multiple substrates may be involved in the manufacture of an electromagnetic circuit, and the method includes bonding further substrates as necessary, further milling and filling operations, and further soldering and/or reflow operations.

Having described several aspects of at least one embodiment and a method for manufacturing an electromagnetic circuit, the above descriptions may be employed to produce various electromagnetic circuits with an overall thickness of 10 mils (0.010 inches, 254 microns) or less, and may include transmission lines, such as the traces as narrow as 4.4 mils (111.8 microns), 2.7 mils (68.6 microns), or even as narrow as 1.97 mils (50 microns), depending upon the tolerances and accuracy of various milling and additive manufacturing equipment used. Accordingly, electromagnetic circuits in accordance with those described herein may be suitable for microwave and millimeter wave applications, including S-Band, X-Band, K-Bands, and higher frequencies, with various embodiments capable of accommodating frequencies over 28 GHz and up to 70 GHz or higher. Some embodiments may be suitable for frequency ranges up to 300 GHz or more.

Additionally, electromagnetic circuits in accordance with those described herein may have a low enough profile (e.g., thickness of 10 mils or less), with accordant light weight, to be suitable for outer space applications, including folding structures to be deployed by unfolding when positioned in outer space.

Further, electromagnetic circuits manufactured in accordance with methods described herein accommodate less expensive and faster prototyping, without the necessity for caustic chemicals, masking, etching, electroplating, etc. Simple substrates with pre-plated conductive material disposed on one or both surfaces (sides) may form the core starting material, and all elements of an electromagnetic circuit may be formed by milling (subtractive, drilling), filling (additive, printing of conductive and/or resistive inks), and bonding one or more substrates. Simple solder reflow operations and insertion of simple conductors (e.g., copper wire) are accommodated by methods and systems described herein.

Further, electromagnetic circuits manufactured in accordance with methods described herein may accommodate deployment on, or designs calling for, non-planar surfaces. Thin, low-profile electromagnetic circuits, such as described herein and others, may be manufactured using mill, fill, and bond techniques as described herein to produce electromagnetic circuits having any desired contour, to adhere to a surface (such as a vehicle) or to support a complex array structure, for instance.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A radio frequency circuit, comprising:
    a first dielectric substrate having a first surface;
    a second dielectric substrate having a second surface, the first and second dielectric substrates being positioned relative to one another such that the second surface faces the first surface;
    a transmission line formed from a conductive cladding disposed upon the first surface, the transmission line being at least partially encapsulated between the first dielectric substrate and the second dielectric substrate;
    a pair of reference conductors, each of the pair of reference conductors positioned adjacent to and co-planar with the transmission line and spaced such that there is a respective gap between each of the pair of reference conductors and the transmission line, each of the pair of reference conductors disposed upon the first surface or the second surface and being at least partially encapsulated between the first dielectric substrate and the second dielectric substrate;
    a first ground plane provided on a third surface of the first dielectric substrate, the third surface being an opposing and substantially parallel surface to the first surface;
    a second ground plane provided on a fourth surface of the second dielectric substrate, the fourth surface being an opposing and substantially parallel surface to the second surface;
    a trench formed through the first dielectric substrate and the second dielectric substrate, the trench extending between and being substantially perpendicular to the first ground plane and the second ground plane; and
    a conductive material deposited in the trench, the conductive material arranged to be in electrical contact with each of the first ground plane and the second ground plane.

2. The radio frequency circuit of claim 1 wherein the pair of reference conductors is formed from the conductive cladding disposed upon the first substrate.

3. The radio frequency circuit of claim 1 wherein the first surface of the first dielectric substrate constitutes a bottom surface, the second surface of the second dielectric substrate constitutes a top surface, the third surface of the first dielectric substrate constitutes a top surface, and the fourth surface of the second dielectric substrate constitutes a bottom surface, each of the pair of ground planes being positioned substantially parallel to the co-planar arrangement of the transmission line and the pair of reference conductors.

4. The radio frequency circuit of claim 3 wherein the conductive material deposited in the trench is configured to form a pair of boundary walls disposed substantially perpendicular to the first and second ground planes and the co-planar arrangement of the transmission line and the pair of reference conductors, the pair of boundary walls being electrically continuous and in electrical contact with the first and second ground planes such that the pair of boundary walls and the first and second ground planes form a conductive electromagnetic boundary around the transmission line in at least two dimensions.

5. The radio frequency circuit of claim 4 wherein the pair of boundary walls is in electrical contact with the pair of reference conductors.

6. The radio frequency circuit of claim 4 further comprising an electrical conductor disposed through a hole in at least one of the first dielectric substrate and the second dielectric substrate, the electrical conductor being in electrical contact with the transmission line.

7. The radio frequency circuit of claim 4 wherein the transmission line produces 1.2 decibels or less of insertion loss per inch at 70 GHz.

8. A transmission line assembly comprising:
    a pair of dielectric substrates;
    an electrical conductor at least partially embedded between the pair of dielectric substrates;
    a pair of reference conductors at least partially embedded between the pair of dielectric substrates and positioned to be co-planar with the electrical conductor and spaced apart from the electrical conductor by a respective gap;
    a pair of ground planes, each of the pair of ground planes disposed adjacent to an outer surface of a respective one of the pair of dielectric substrates, each of the pair of ground planes being substantially parallel to each other and to the co-planar arrangement of the electrical conductor and the pair of reference conductors;
    a pair of electromagnetic boundaries formed of an electrically continuous conductor disposed through the pair of dielectric substrates, substantially extending between the pair of ground planes and in electrical communication with the pair of ground planes, wherein the pair of electromagnetic boundaries is in electrical communication with the pair of reference conductors; and
    a first electrical component electrically coupled to a first end of the electrical conductor and a second electrical component electrically coupled to a second end of the electrical conductor, the electrical conductor being configured to convey an electromagnetic signal of greater than 24 GHz between the first electrical component and the second electrical component.

9. The transmission line assembly of claim 8 wherein the electrical conductor is a first electrical conductor and further comprising a second electrical conductor in electrical communication with the first electrical conductor, the second electrical conductor disposed through at least one of the pair of dielectric substrates.

10. A method of fabricating an electromagnetic circuit, the method comprising:
    providing a first dielectric substrate having a conductive cladding disposed upon a first surface thereof;
    machining the conductive cladding to remove a portion of the conductive cladding to form a transmission line, the removed portion forming a respective gap between the transmission line and a remaining portion of the conductive cladding, at least some of the remaining portion of the conductive cladding forming a pair of reference conductors on either side of, and co-planar with, the transmission line;

providing a second dielectric substrate having a second surface and positioning the second dielectric substrate so that the second surface faces the first surface, thereby at least partially encapsulating the transmission line and the pair of reference conductors between the first dielectric substrate and the second dielectric substrate;

providing the first dielectric substrate with a first ground plane disposed on a third surface, the third surface being an opposing and substantially parallel surface to the first surface, and providing the second dielectric substrate with a second ground plane disposed on a fourth surface, the fourth surface being an opposing and substantially parallel surface to the second surface, each of the first ground plane and the second ground plane being substantially parallel to each other and to the co-planar arrangement of the transmission line and the pair of reference conductors;

machining the first dielectric substrate and the second dielectric substrate to form a trench through the first dielectric substrate and the second dielectric substrate, the trench extending between and being substantially perpendicular to the first ground plane and the second ground plane; and filling the trench with a conductive material, the conductive material arranged to be in electrical contact with each of the first ground plane and the second ground plane.

11. The method of claim 10 further comprising conveying to the transmission line an electromagnetic signal having a frequency in the range of 24 GHZ to 75 GHz.

12. The method of claim 10 wherein the conductive material is also arranged to be in electrical contact with the pair of reference conductors.

13. The method of claim 10 further comprising:
drilling a hole in at least one of the first dielectric substrate and the second dielectric substrate to provide access to a portion of the transmission line; and
providing an electrical conductor disposed through the hole, the electrical conductor arranged to be in electrical contact with the transmission line.

14. The method of claim 13 further comprising electrically coupling the electrical conductor to an electrical component, the electrical conductor being thereby configured to convey a signal between the transmission line and the electrical component, the electrical component being at least one of a terminal, a connector, a cable, and an electromagnetic radiator.

* * * * *

UNITED STATES PATENT AND TRADEMARK OFFICE
CERTIFICATE OF CORRECTION

PATENT NO. : 10,826,147 B2  
APPLICATION NO. : 16/183169  
DATED : November 3, 2020  
INVENTOR(S) : Thomas V. Sikina et al.

It is certified that error appears in the above-identified patent and that said Letters Patent is hereby corrected as shown below:

In the Specification

Column 10, Line 52, delete "0.75 mil".

In the Claims

Column 13, Line 62, Claim number 3, delete "pair of" and insert -- first and second --.

Signed and Sealed this  
First Day of June, 2021

Drew Hirshfeld  
*Performing the Functions and Duties of the*  
*Under Secretary of Commerce for Intellectual Property and*  
*Director of the United States Patent and Trademark Office*